United States Patent [19]

Takato et al.

[11] Patent Number: 5,248,891

[45] Date of Patent: Sep. 28, 1993

[54] HIGH INTEGRATION SEMICONDUCTOR DEVICE

[76] Inventors: Hiroshi Takato, Coopfukuzumi 102, 631 Ichinotsubo, Nakahara-ku, Kawasaki-shi, Kanagawa-ken; Hidehiro Watanbe, 1-15-3-102 Sugeinadazutsumi, Tama-ku, Kawasaki-shi, Kanagawa-ken, both of Japan

[21] Appl. No.: 956,542

[22] Filed: Oct. 2, 1992

Related U.S. Application Data

[63] Continuation of Ser. No. 679,129, Mar. 28, 1991, abandoned, which is a continuation of Ser. No. 328,219, Mar. 24, 1989, abandoned.

[30] Foreign Application Priority Data

Mar. 25, 1988 [JP] Japan .................. 63-071242

[51] Int. Cl.⁵ ............ H01L 29/68; H01L 29/78; H01L 29/92; H01L 23/48
[52] U.S. Cl. ............. 257/309; 257/296; 257/306; 257/754; 257/773
[58] Field of Search ............ 557/23.6, 23.11; 257/296–300, 305–313, 754, 773, 774

[56] References Cited

U.S. PATENT DOCUMENTS

| | | | |
|---|---|---|---|
| 4,291,322 | 9/1981 | Clemens et al. | 257/774 |
| 4,392,220 | 7/1983 | Chan | 357/23.11 |
| 4,672,410 | 6/1987 | Miura et al. | 357/23.6 |
| 4,849,801 | 7/1989 | Honjyo et al. | 357/23.6 |
| 4,920,390 | 4/1990 | Fuse et al. | 357/23.6 |
| 5,116,775 | 5/1992 | Katto et al. | 437/26 |

FOREIGN PATENT DOCUMENTS

| | | | |
|---|---|---|---|
| 57-78181 | 5/1982 | Japan | 357/23.6 |
| 63-175464 | 7/1988 | Japan | 357/23.6 |

OTHER PUBLICATIONS

H. Frantz et al., "MOSFET substrate bias-voltage generator", *IBM Technical Disclosure Bulletin*, vol. 11 (Mar. 1969) p. 1219.

*Primary Examiner*—J. Carroll

[57] ABSTRACT

A high integration semiconductor device comprises a semiconductor substrate and element separating regions formed on the semiconductor substrate to divide the semiconductor substrate into a plurality of regions to be formed as semiconductor active regions. The semiconductor active regions have contact portions for conducting the semiconductor active regions to other portions. The element separating regions are so constituted that the width of a short side of each of the semiconductor active regions at each contact portion is narrower than the width of a short side of the other portion of the semiconductor active region.

5 Claims, 9 Drawing Sheets

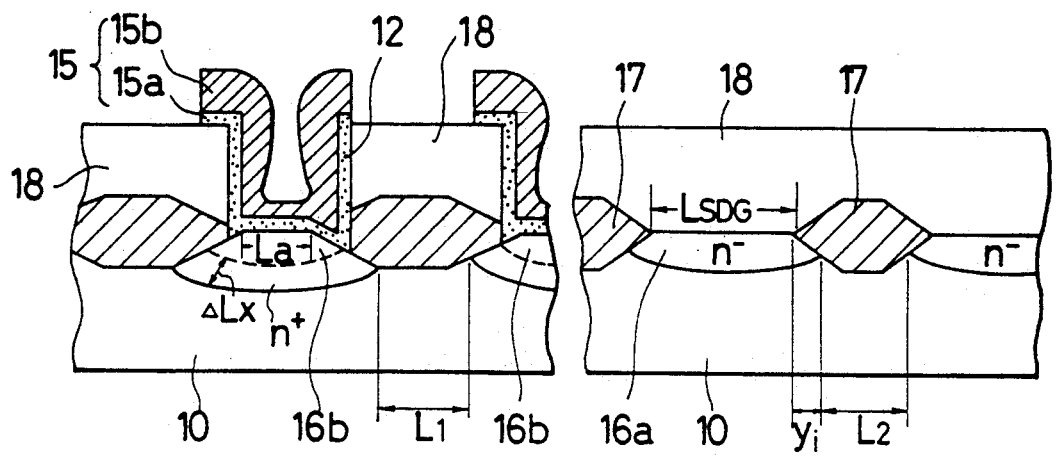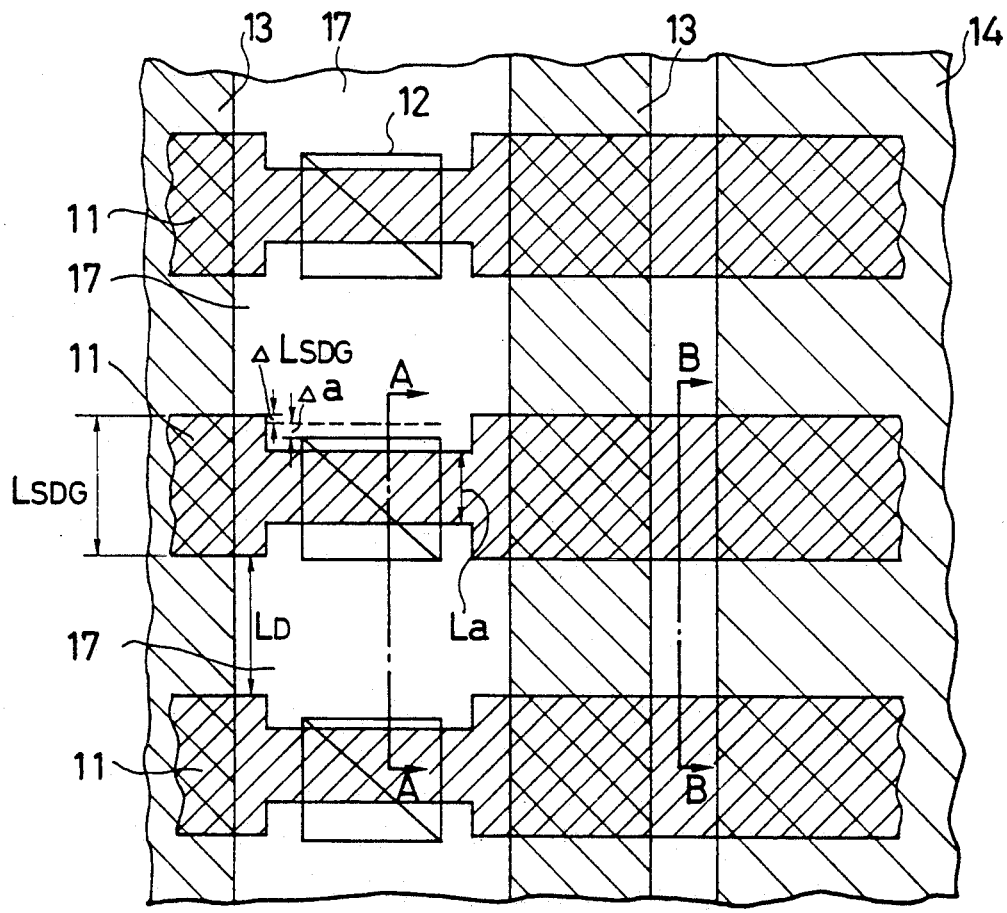

HIGH INTEGRATION SEMICONDUCTOR DEVICE

This application is a continuation of application Ser. No. 07/679,129, filed Mar. 28, 1991, abandoned, which is a continuation of Ser. No. 07/328,219, filed Mar. 24, 1989, abandoned.

BACKGROUND OF THE INVENTION

1. Field of the Invention

The present invention relates to high integration semiconductor devices of improved reliability.

2. Description of the Prior Art

In recent years, demands for high integration and high performance semiconductor circuit devices are increasing. In this regard, a problem is how to meet such demands within allowable design rules and techniques.

With the advance of contact forming techniques in the field of semiconductor devices, there have been proposed a direct contact method to directly diffuse impurities through contact holes to a polycrystalline silicon layer to form active regions serving as contacts, and an SEG (SSG) method to selectively grow silicon at contact portions in active regions. According to these methods, the contacts are formed in a self-aligning manner and, through the contacts, the semiconductor active regions are accessible oneway or completely.

FIG. 1 is a partial view showing an example of dynamic random access memories (DRAMs). In the figure, the width of an active region 1 is $L_{SDG}$. An element separating gap between adjacent active regions 1 is $L_D$. On a layer above each active region 1, a bit line (not shown) is formed and connected to a contact 2. A gate 3 is formed orthogonally to the active region 1 to form a word line. On the right-hand side of the gate 3, a capacitor plate 4 is formed to store electric charges between the capacitor plate 4 and the substrate active region 1.

To form an array of cells composed of elements such as those shown in FIG. 1, the contact forming methods described before are employed. When contacts are formed in self-aligning manner in substrate active regions according to the contact forming methods, a displacement $\Delta$ a may occur when each contact hole is opened. The displacement $\Delta$ a shall be taken into consideration to prevent elements from short-circuiting. The element separating gap $L_D$ shall be greater than a design minimum gap $L_{min}$ necessary for maintaining proper performance of the semiconductor device.

According to the contact forming methods mentioned before, impurities are diffused from each contact portion to the substrate active region 1 so that density of the impurities below the contact portion will be high to elongate a diffusion length $\Delta$ y below, the contact portion. Then, the element separating gap $L_D$ below the contact portion must satisfy $L_D \geq L_{min} + \Delta a + \Delta y$.

For integrating the semiconductor device, the element separating gap $L_D$ must be as small as possible while the width $L_{SDG}$ of the substrate active region shall be as large as possible, to increase the driving capability of transistors and the capacitance of capacitors of the semiconductor device. If an area of each capacitor for storing information of the semiconductor device is reduced, the amount of charges to be stored in the capacitor decreases. As a result, errors will occur in reading the information stored in the capacitor or the stored information will be destroyed due to disturbance.

Even the latest contact forming techniques require the element separating gap $L_D$ at the contact region to be greater than the design minimum gap $L_{min}$. If the width $L_{SDO}$ of the substrate active region is reduced to integrate the semiconductor device, performance of the device may deteriorate. Namely, high integration contradicts high performance.

To realize high integration, an area of each capacitor of the semiconductor device shall be reduced. To achieve this, a stacked type memory cell has been proposed to stack a MOS capacitor on a memory cell region. One electrode of the MOS capacitor is connected to one electrode of a switching transistor formed on a semiconductor substrate to increase capacitance of the MOS capacitor.

An example of such a stacked type memory cell is shown in FIGS. 2a and 2b in which FIG. 1a is a plan view showing memory cells for two bits and FIG. 1b a sectional view taken along a line A—A of the plan view.

In the figures, an element separating insulation film 102 is formed in a p-type silicon substrate 101. Each memory cell region is separated by the element separating insulation film 102. A MOSFET as a switching transistor is formed in the memory cell region. The MOSFET has source or drain region 103. A numeral 104a is a gate electrode of the MOSFET, and 104b is a gate electrode (word line) of a MOSFET of the next memory cell acting as a switching transistor. An insulation film 109 is formed on the gate electrodes 104a and 104b, and a lower electrode 105 of a capacitor is formed on the insulation film 109. The lower electrode 105 contacts with the source or drain region 103 of the MOSFET via a contact 108. An insulation film 107 is formed on the lower electrode 105, and an upper electrode 106 of the capacitor is formed on the insulation film 107.

With this arrangement, an area of each capacitor is expanded to increase its capacitance. However, as shown in FIG. 2a a distance $L_E$ between contact areas 108a and 108b of the adjacent two bits cannot be reduced. If the distance $L_E$ is reduced, information stored in the capacitor will easily be lost due to punch through occurring between the two cells.

The height of the gate electrode 104a of the switching transistor of the memory cell differs from the height of the gate electrode 104b (word line) of the switching transistor of the next memory cell which runs on the element separating insulation film 102. This may form a step in the insulation film 109 which is formed before the formation of the lower electrode 105. When a contact hole 110 is opened through the insulation film 109, the step may deteriorate dimensional accuracy of the contact hole 110. Moreover, at the time of carrying out an etching process such as a reactive ion etching process, electrode materials may remain along a side face of the word line 104b as indicated with a reference mark "F" in FIG. 2a to cause short circuit between lower electrodes of the adjacent cells.

SUMMARY OF THE INVENTION

To solve the problems mentioned in the above, an object of the present invention is to provide high integration semiconductor devices of improved reliability.

Another object of the present invention is to provide semiconductor devices capable of improving the driving capability of their transistors while maintaining element separation characteristics of the devices.

Still another object of the present invention is to provide semiconductor devices capable of sufficiently increasing the capacitance of their capacitors while maintaining element separation characteristics of the devices.

Still another object of the present invention is to provide semiconductor devices capable of integration while preventing punch through from occurring between elements of the devices.

According to an aspect of the present invention, a semiconductor device has a plurality of semiconductor active regions separated from one another by element separating regions. The length of a short side of each of the semiconductor active regions at a contact portion through which the semiconductor active region is conducted to other part is narrower than the length of the other portion of the semiconductor active region.

When a contact is formed at the contact portion with the use of a contact forming technique which may accompany impurity diffusion, element separation characteristics at the contact portion will not deterlorate even if a length of diffusion of the impurities is extended or even if the contact is displaced, because the length of the short side of each semiconductor active region is narrowed at the contact portion compared to the other portion on of the semiconductor active region.

Due to the narrowed short side portion, the width $L_{SDG}$ of the active region will not be changed by the formation of the contact. In other words, the width $L_{SDG}$ of the active region at anywhere except at the contact portion can be widened as long as the element separation characteristics allow. By virtue of this, the driving capability of transistors and the capacitance of capacitors of the semiconductor device can be increased to improve performance of the semiconductor device.

These and other objects, features and advantages of the present invention will be more apparent from the following detailed description of preferred embodiments in conjunction with the accompanying drawings.

BRIEF DESCRIPTION OF THE DRAWINGS

FIG. 3a is a plan view showing a memory cell according to a first embodiment of the present invention;

FIG. 3b is a sectional view taken along a line A—A of FIG. 3a;

FIG. 3c is a sectional view taken along a line B—B of FIG. 3a;

FIG. 5b is a sectional view taken along a line A—A of FIG. 5a;

FIG. 5c is a sectional view taken along a line C—C of FIG. 5a;

FIG. 7b is a sectional view taken along a line A—A of FIG. 7a;

FIG. 7c is a sectional view showing a modification of the third embodiment shown in FIG. 7a;

FIG. 8b is a sectional view taken along a line A—A of FIG. 8a; and

FIG. 8c is a sectional view taken along a line B—B of FIG. 8a.

DETAILED DESCRIPTION OF THE EMBODIMENTS

Figure 1:
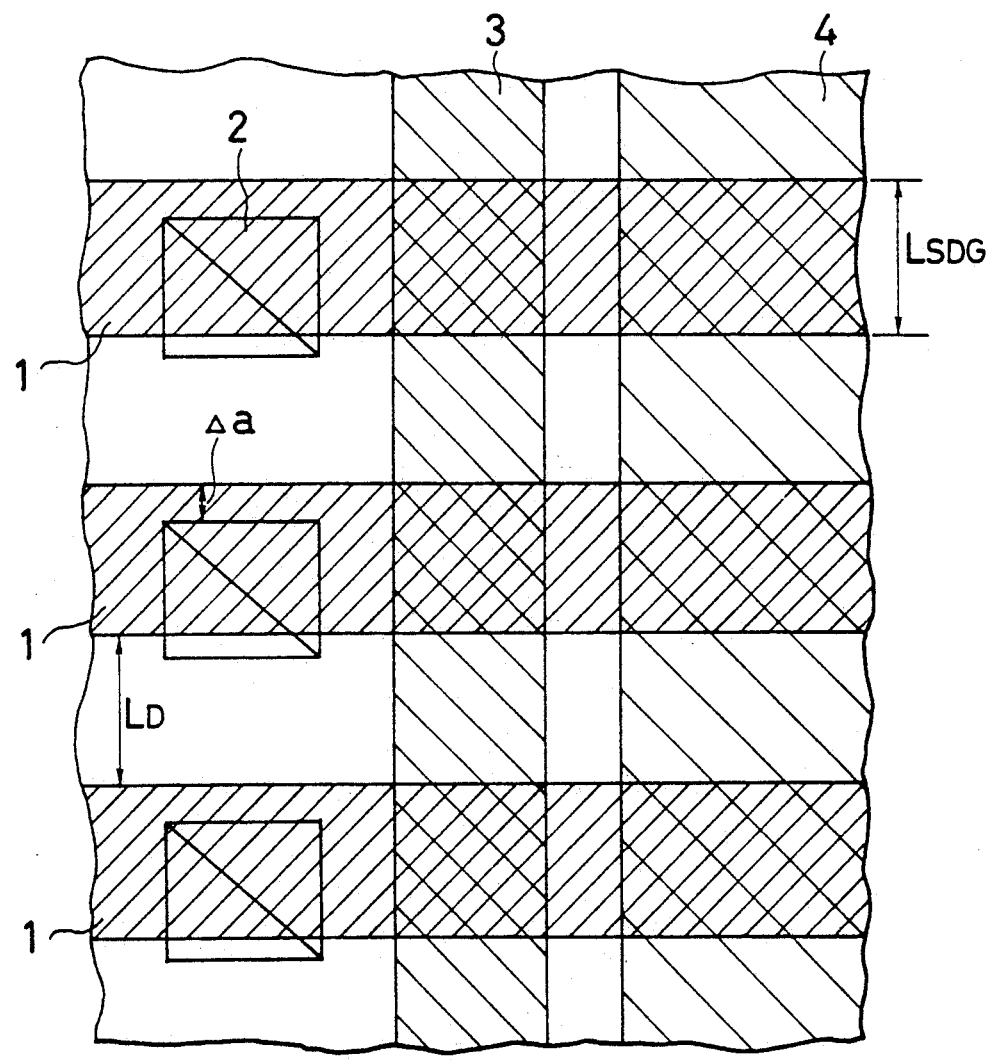
FIG. 1 is a schematic view showing drawbacks of a conventional memory cell.
Figure 2A:
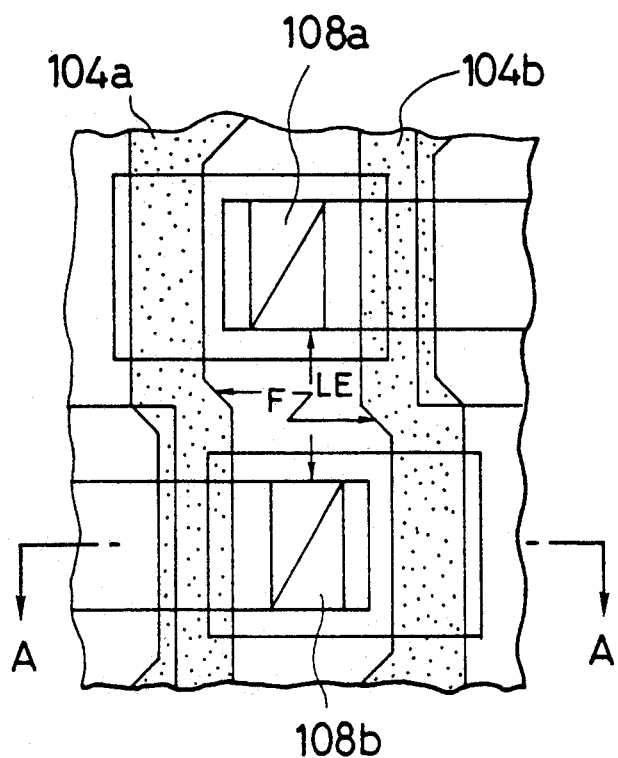
FIGS. 2a and 2b are schematic views showing a conventional stacked type memory cell.
Figure 2B:
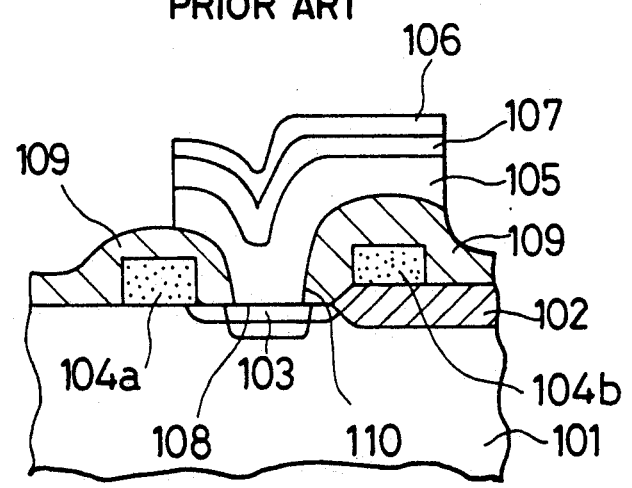

FIGS. 3a to 3c are views showing a DRAM employing an open bit line system with memory cells according to the present invention. FIG. 3b is a sectional view taken along a line A—A (bit line contact region) of FIG. 3a, and FIG. 3c is a sectional view taken along a line B—B (one of source and drain regions) of FIG. 3a.

In the figures, a p-type silicon substrate 10 includes an array of active regions 11. The width of each active region 11 is $L_{SDG}=1.0$ $\mu$m, and an element separating gap between the active regions 11 is $L_D$. A contact hole of $0.9 \times 1.0$ $\mu$m is opened through an upper layer of the active region 11. At a portion where the contact hole 12 is formed, the width $L_{SDG}$ of the active region 11 is narrowed by $\Delta L_{SDG}=0.25$ $\mu$m on each side. Through the contact hole 12, a bit line 15 is formed and connected to the active region 11.

An array of gates 13 are formed orthogonal to the array of active regions 11 to form word lines. On the right side of the gates 13, a capacitor plate 14 is formed to store electric charges between the capacitor plate 14 and the substrate active regions 11. Numerals 16a and 16b are source and drain regions, respectively, made of an inverted conductive type diffusion layer to the substrate 10.

Although the bit line 15 is not shown in FIG. 3a, the bit line 15 is arranged longitudinally on each substrate active region 11. This fact is applicable for the other embodiments to be explained below.

A manufacturing method of the DRAM will be explained with reference to FIGS. 4a to 4f in which FIGS. 4a and 4b correspond to sections A—A and B—B of FIG. 3a, respectively.

Figure 4A:
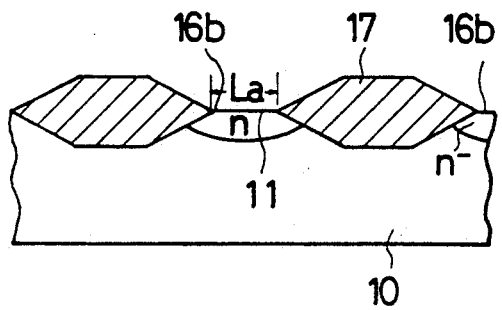
FIGS. 4a to 4f are views showing manufacturing processes, respectively, of the memory cell shown in FIGS. 3a to 3c.
Figure 4B:
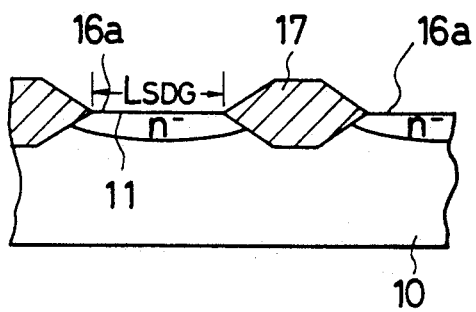

In FIGS. 4a and 4b, element separating regions 17 made of silicon oxide and semiconductor active regions 11 are formed in a substrate 10 according to standard methods. The element separating regions 17 are formed such that the width La of a short side of each of the active regions 11 at each contact portion is narrower than the width $L_{SDG}$ of the other part of the active region 11. A capacitor plate 14 (FIG. 3a) is formed to constitute capacitors, and transfer gates 13 (FIG. 3a) are formed to constitute word lines. The surface of the substrate 10 is oxidized to form an oxide film of about 200 Å in thickness. Phosphorus ions are implanted to the substrate 10 at 30 KeV and $4 \times 10^{13}$ cm$^{-2}$ to form n$^-$-type source and drain regions 16a and 16b.

Figure 4C:
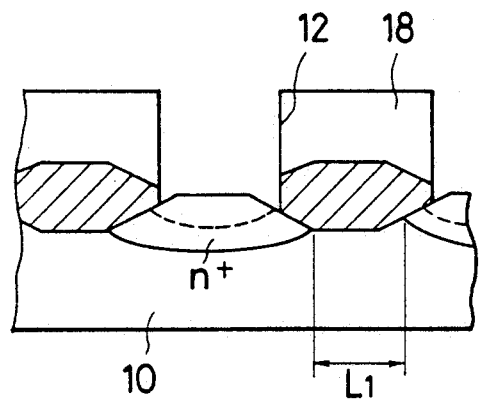
Figure 4D:
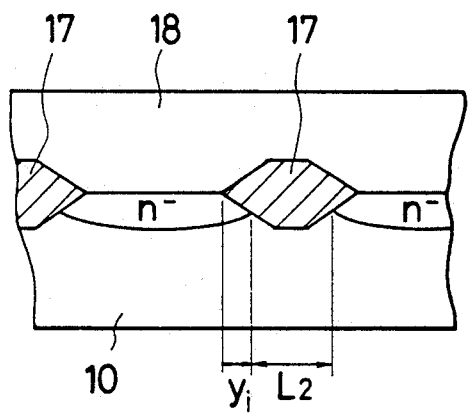

In FIGS. 4c and 4d, an interlayer insulation film 18 is formed, and each contact hole 12 is formed through the interlayer insulation film 18.

Figure 4E:
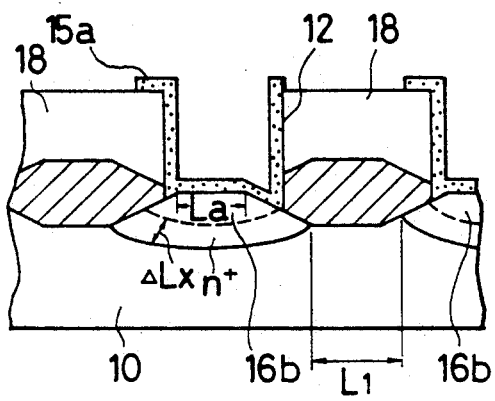
Figure 4F:
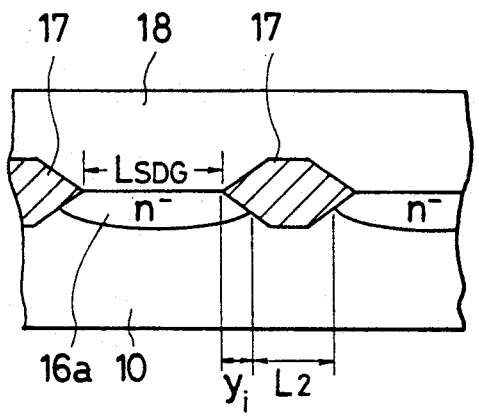

In FIGS. 4e and 4f, a polycrystalline silicon layer 15a is deposited in the thickness of 1000 Å, and arsenic ions As+ arc implanted at 80 KeV and $5 \times 10^{15}$ cm$^{-2}$. A heat treatment is carried out to diffuse impurities at the contact portion to form an n+ layer which is conductive with respect to the active regions 11. Instead of the arsenic ions, phosphorus ions may be implanted. The ions implanted in the polycrystalline silicon reach an interface of the substrate to destruct a natural oxide film. Instead of the ion implantation, thermal diffusion of phosphorus may be carried out with respect to the polycrystalline silicon.

To reduce resistance of bit lines, a molybdenum silicide layer MoSi 15b of 3000 Å in thickness is deposited and patterned to complete a DRAM as shown in FIGS. 3b and 3c.

Supposing a diffusion length "yi" in the active region 11 at anywhere except at the contact portion is 0.2 μm, a distance $L_2$ between the active regions 11 separated by the element separating region 17 is about 0.6 μm. On the other hand, at the contact portion, a distance $L_1$ between the active regions 11 separated by the element separating region 17 is about 0.6 to 0.7 μm which is nearly equal to the distance $L_2$.

With respect to the minimum element separating gap $L_D$, the width $L_{SDO}$ of the active region is narrowed at the contact portion by $\Delta L_{SDG} = 0.25$ μm on each side of the active region. Therefore, even if the contact is displaced by about 0.1 μm and even if the diffusion length $\Delta L_x$ (FIG. 3b) is extended by about 0.15 μm compared to "yi," the respective active regions can sufficiently be separated from each other.

Figure 5B:
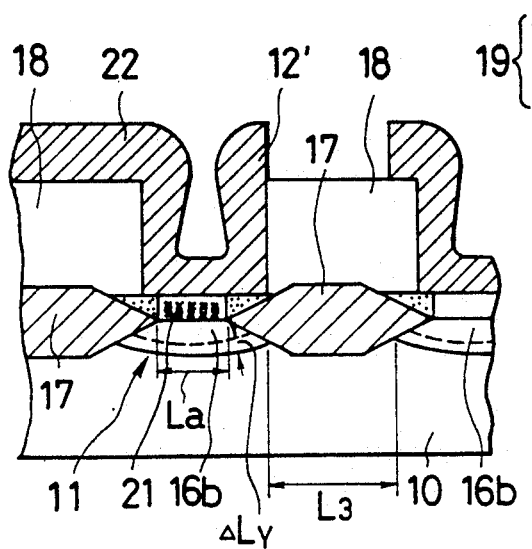
Figure 5C:
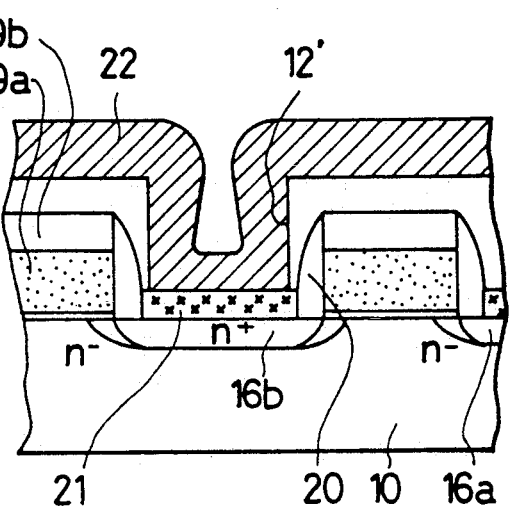
Figure 5A:
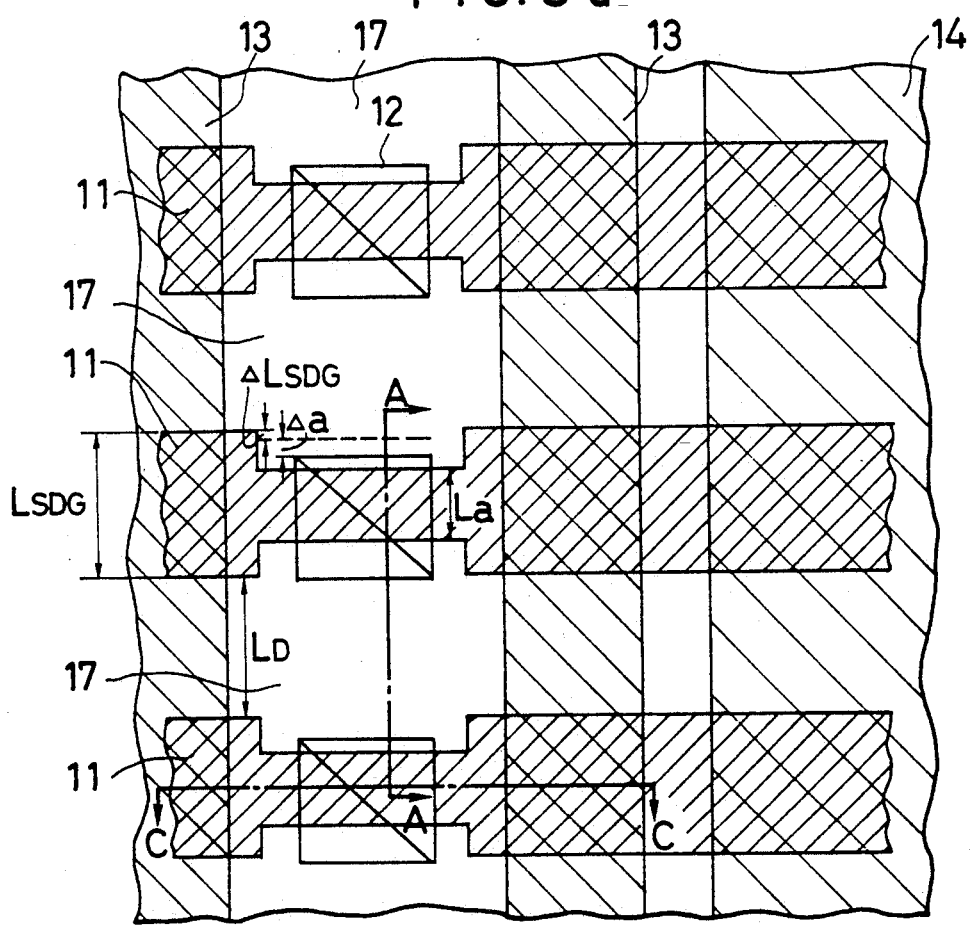
FIG. 5a is a plan view showing a memory cell according to a second embodiment of the present invention.

FIGS. 5a to 5c show the second embodiment of the invention in which contacts of a DRAM are formed, according to a silicon selective epitaxial growing (SEG) technique.

In FIGS. 5b and 5c, the DRAM has source and drain regions 16a and 16b on which a silicon layer 21 is selectively epitaxial-grown. Although the sectional views (FIGS. 5b and 5c) are different from FIGS. 3b and 3c, the plan view (FIG. 5a) is the same as FIG. 3a of the first embodiment. Dimensions of respective regions and parts shown in FIG. 5a are the same as those of the first embodiment so that their explanations will be omitted. FIG. 5a is a sectional view taken along a line A—A of FIG. 5a, and FIG. 5c is a sectional view taken along a line C—C of FIG. 5a.

A method of manufacturing the DRAM of the second embodiment will be explained with reference to FIGS. 6a to 6d in which FIGS. 6a and 6b correspond to sections A—A and C—C of FIG. 5a, respectively.

Figure 6A:
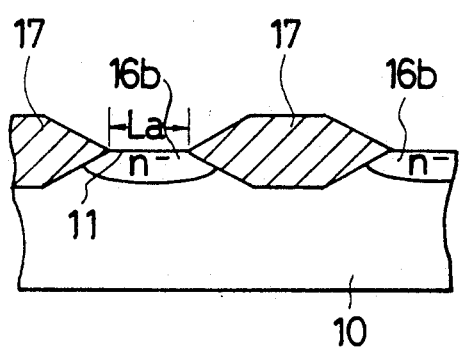
FIGS. 6a to 6d are views showing manufacturing processes, respectively, of the memory cell shown in FIGS. 5a to 5c.
Figure 6B:
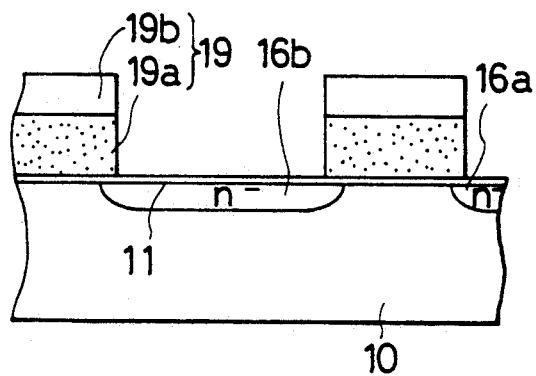

In FIGS. 6a and 6b, element separating regions 17 and active regions 11 are formed in a p-type silicon substrate 10 according to standard methods. Similar to the first embodiment, the element separating regions 17 are formed such that the width La of a short side of each of the semiconductor active regions 11 at each contact portion is narrower than the width $L_{SDO}$ of the other part of the semiconductor active region 11. On the active regions 11, a capacitor plate (not shown) is formed to form capacitors. Then, transfer gates are formed to constitute word lines. Namely, a polycrystalline silicon layer 19a of 4000 Å in thickness is deposited, and a silicon oxide film 19b of 3000 Å in thickness is deposited by CVD method. The layers 19a and 19b are patterned to form laminated structure. Similar to the first embodiment, impurities are diffused to form n--type source and drain regions 16a and 16b.

Figure 6C:
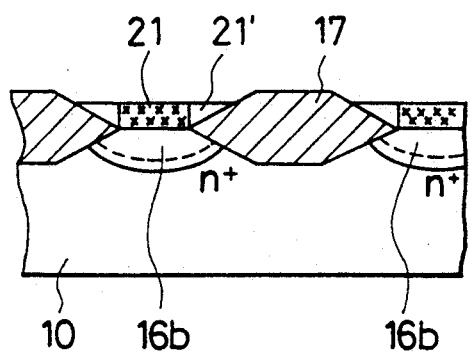
Figure 6D:
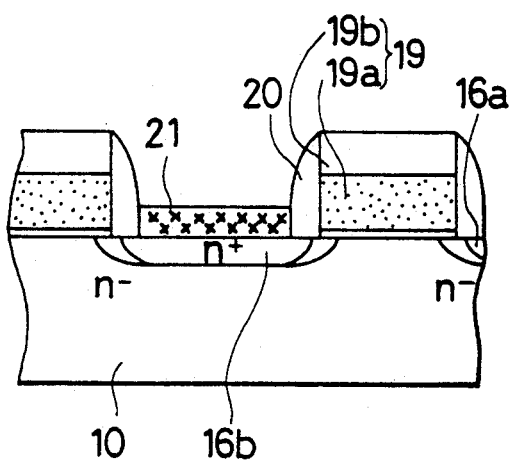

In FIGS. 6c and 6d, a silicon oxide film 20 is deposited by CVD method. The whole surface is subjected to reactive ion etching or anisotropic etching to leave the silicon oxide film 20 only on the sidewalls of the gates (a CVD oxide film sidewall leaving process). After contact portions are formed in the active regions 11 in self-aligning manner, an SEG method is employed to grow a silicon layer 21 doped with phosphorus or arsenic at high density. Moreover, it is also possible to carry out the doping of the phosphorus or arsenic after the growing of the silicon layer 21. The silicon layer 21 extends over the element separating film 17 to form a silicon layer 21' on the element separating film 17. The silicon layer 21' is of poor crystalline. An interlayer insulation film 18 is formed, and contact holes 12' are opened through the interlayer insulation film 18. An aluminum wiring layer pattern 22 is formed in the contact holes 12' to complete a DRAM as shown in FIGS. 5b and 5c.

In FIGS. 5b and 5c, the silicon layer 21 formed in the contact portions according to the SEG method contains impurities at high density so that a diffusion length $\Delta L_y$ (FIG. 5b) is longer in each contact region. However, since the width of the active region 11 is narrowed at each contact portion, a distance L3 between the diffusion separated by the element separating region 17 about 1.0 μm which is sufficient to separate elements from each other.

Figure 7A:
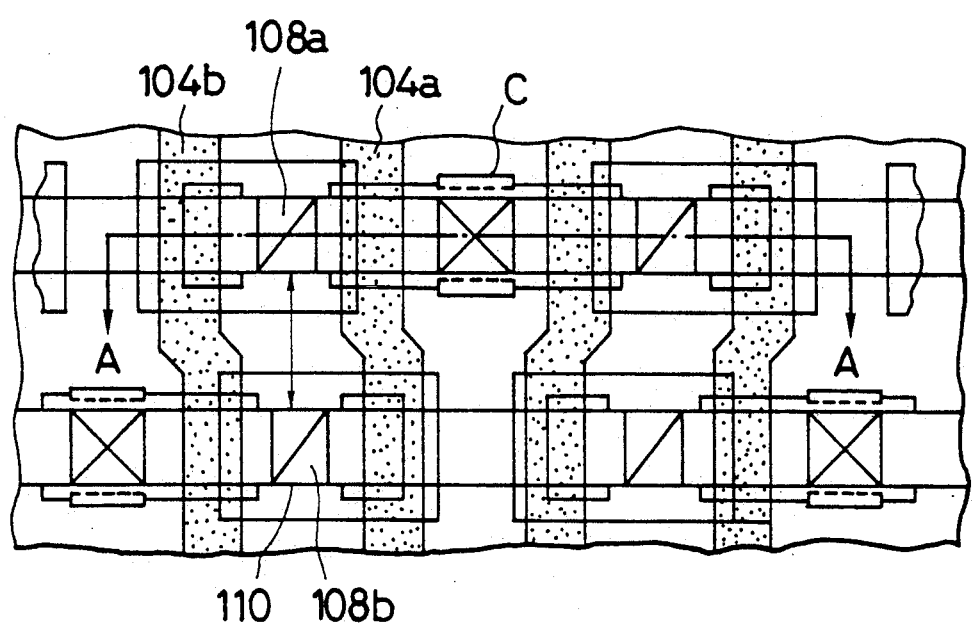
FIG. 7a is a plan view showing a memory cell according to a third embodiment of the present invention.

The third embodiment of the invention will be explained with reference to FIGS. 7a and 7b which show a stacked type memory cell. FIG. 7a 18 a plan view of the stacked type memory cell, and FIG. 7b is a sectional view taken along a line A—A of the plan view.

Figure 7B:
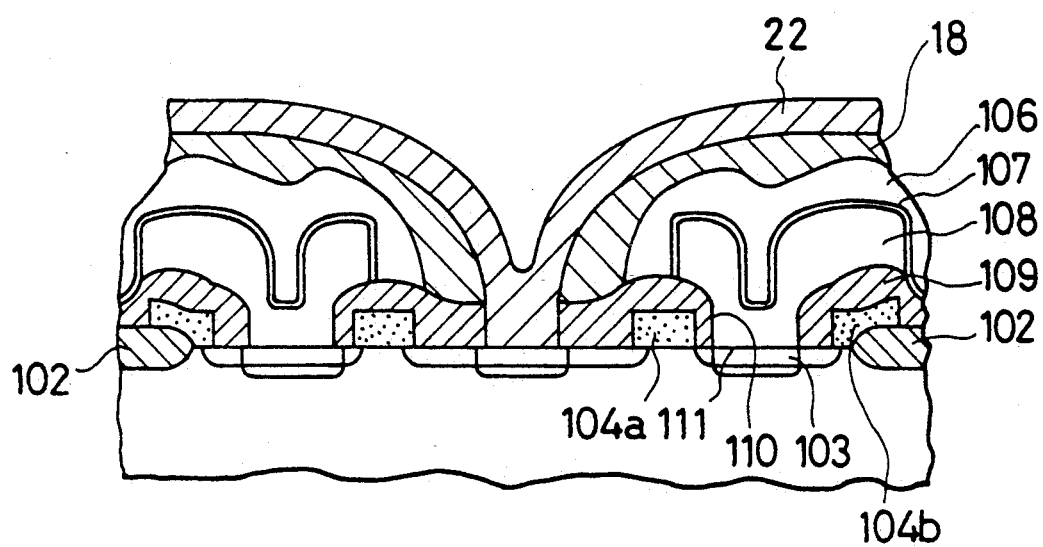

In FIGS. 7a and 7b, a numeral 104a is a gate electrode (a word line) of a MOSFET, and 104b is a gate electrode (a word line) of a MOSFET which is a switching transistor of the next memory cell. An insulation film 109 is formed on the gate electrodes 104a and 104b. On the insulation film 109, a lower capacitor electrode 108 is formed. The lower capacitor electrode 108 is made of polycrystalline silicon doped with impurities at high density. The lower capacitor electrode 108 contacts with an n--type source or drain region 103 of the MOSFET via a contact portion 111. An element separating insulation film 102 separates memory cell regions (active regions) from each other. At the contact portion 111, the width of a short side of the active region is shorter than the width of the other part of the active region.

The width of the active region is narrowed at the contact portion 111 and is widened under the transit gate electrode 104b of the switching transistor of the memory cell.

Other portions of the third embodiment are the same as those of the stacked type memory cell of FIG. 1. The same portions as those of FIG. 1 are represented with like numerals in FIGS. 7a and 7b.

With this arrangement, an area of each capacitor can be expanded to increase capacitance and performance of the capacitor. A distance between the contacts 108a and 108b of the adjacent two bit memory cells is small However, the width of the short side of the contact forming region (active region) is smaller than the width of the other part of the active region. Therefore, even if the contact hole is displaced, punch through will not occur between adjacent memory cells. Therefore, reliability of the semiconductor device is improved.

In this embodiment, the active region partly overlaps the gate electrode 104b (word line) of the switching transistor of the next memory cell so that the height of the gate electrode 104a will be equal to the height of the gate electrode 104b around the contact. Therefore, the contact hole 110 is easily positioned when the contact hole 110 is opened through the insulation film 109 to further improve the reliability.

Figure 7C:
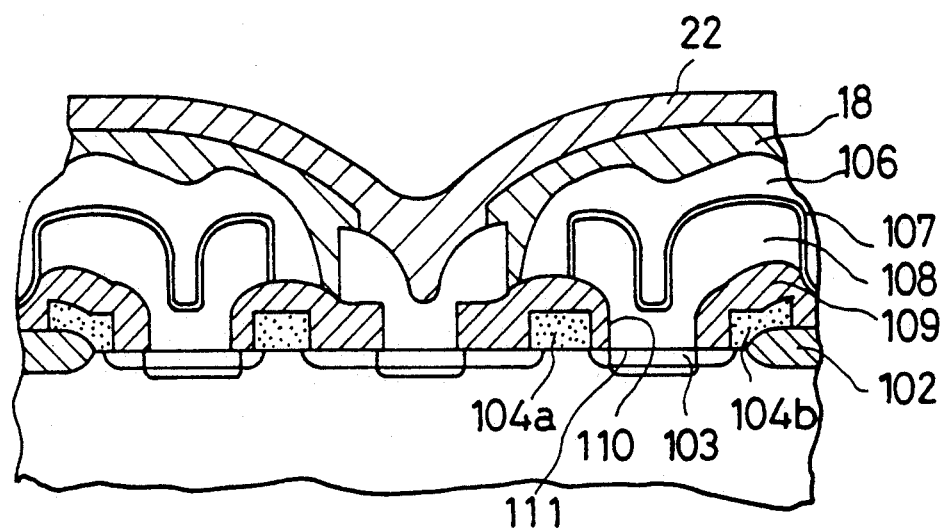

FIG. 7c shows a modification of the third embodiment. When a lower electrode 108 of a capacitor is formed, a pad electrode doped with impurities is arranged at a bit line contact portion.

In the embodiment and modification shown in FIGS. 7a to 7c, the width of the active region has been narrowed at the contact portion of each capacitor compared to the width of the other part. However, the width of the active region may also be narrowed at bit line contact portions as indicated with dotted lines C in FIG. 7a to further improve reliability.

Figure 8B:
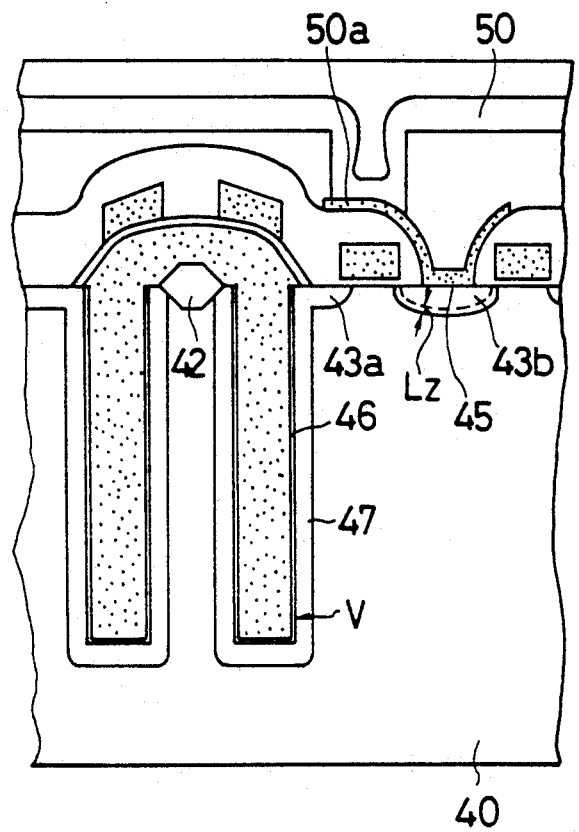
Figure 8C:
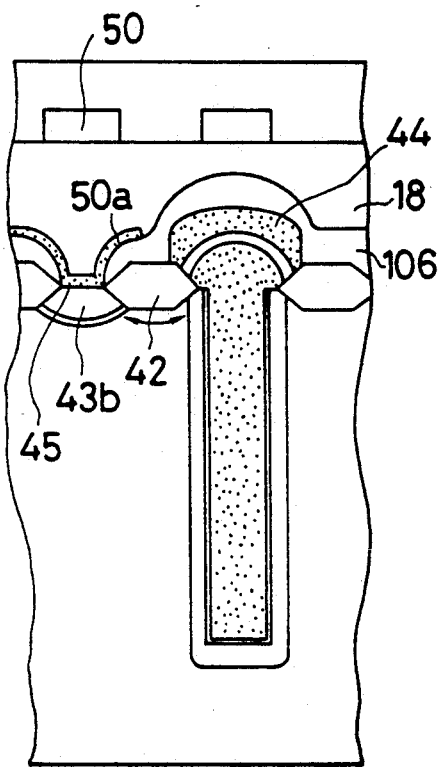
Figure 8A:
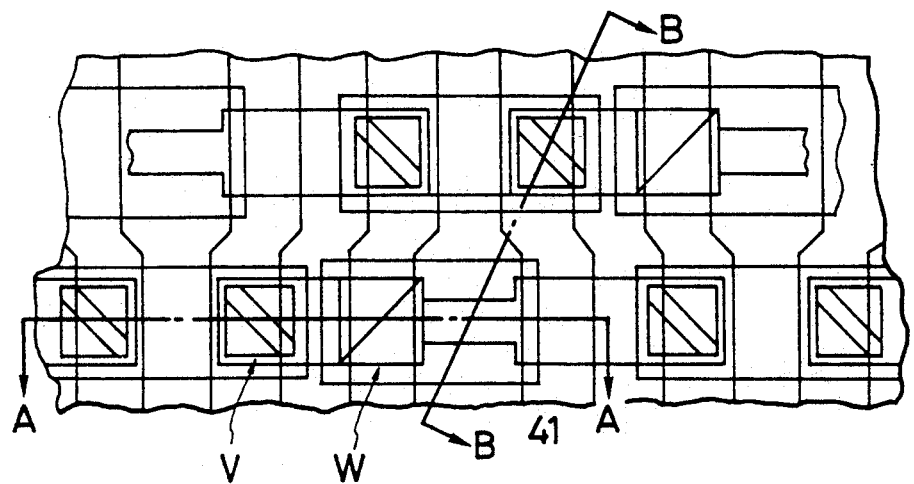
FIG. 8a is a plan view showing a memory cell according to a fourth embodiment of the present invention.

FIGS. 8a to 8c are Views showing the fourth embodiment of the invention which is a trench type DRAM. FIG. 8b is a sectional view taken along a line A—A of FIG. 8a, and FIG. 8c ls a sectional view taken along a line B—B of FIG. 8a.

A trench type memory cell comprises a p-type silicon substrate 40 in which deep grooves V each of several micrometers in depth are recessed at predetermined intervals on the side of an n+-type source or drain region 43a. A silicon oxide film 46 is formed on the sidewall of each groove V. A polycrystalline silicon plate electrode 47 is embedded in the groove V. The silicon oxide film 46 and electrode 47 constitute a capacitor. The capacitor occupies a small area on the surface of the silicon substrate but it has a large capacitor area because of its depth to realize large capacitance.

In this embodiment, at a contact portion 45 of a bit line 50 with respect to adrain or source region 43b of a MOSFET, the width of an element region 41 separated by element separating films 42 is smaller than the width of the other part of the element region 41. The bit line 50 is contacted with the n−-type drain or source region 43b through a pad portion 50a which is made of polycrystalline silicon doped with impurities at high density. A numeral 44 represents a word line, and "W" a contact portion between a pad electrode and the bit line.

With this arrangement, an area of each capacitor can be expanded to improve capacitance and performance of the capacitor. Although a distance between contacts of adjacent two bit memory cells is small, the width of a short side of the contact forming region (active region) at the contact portion is smaller than the width of the other part of the memory cell region. Therefore, even if the diffusion length Lz at the contact portion is extended further, no puch through will occur between the adjacent memory cells. Therefore, reliability of the stacked type memory is improved.

When an interlayer insulation film is formed of lamination of an SiOa film formed by CVD method and a BPSG film formed on the SiO2 film, phosphorus contained in the BPSC film penetrates contact portions through various heat processes to be carried out afterward to deepen the diffusion layer. However, the invention can relax the influence of the deepened diffusion layer.

Although the source and drain regions have been n-type in the embodiments, they may be n+ type.

The reason why impurities are implanted after the formation of contact holes is to lower contact resistance. If a contact extends over a field, a field oxide film may be etched and eroded during the process of forming a contact portion. This will 1 expose a junction from corners of a semiconductor active region. To prevent the junction from being exposed, it is additionally necessary to implant the impurities after the formation of contact holes.

In summary, the present invention provides a semiconductor device comprising a semiconductor substrate in which semiconductor active regions are formed. The width of a short side of each of the semiconductor active regions is narrowed at each contact portion through which the semiconductor active region is conducted outside, compared to the width of the other portion of the semiconductor active region.

Even if a diffusion length at the contact portion is extended or even if the contact portion is displaced, element separating capability at the contact portion will not deteriorate. Therefore, the width of a short side of the substrate active region at anywhere except at the contact portion can be widened within an element separation limit to improve performance and reliability of the semiconductor device.

Various modifications will become possible for those skilled in the art after receiving the teachings of the present disclosure without departing from the scope thereof.

What is claimed is:

1. A semiconductor integrated circuit device, comprising;
   a semiconductor substrate of a first conductivity type;
   a plurality of active regions extending parallel to each other, each said active region having a transistor comprising source and drain regions of a second conductivity type, a channel region and a gate electrode, said source region, drain region and said channel region formed therebetween being located along the extending direction of said active region;
   field insulating regions formed between adjacent ones of said active regions, said insulating regions being formed at the surface of said semiconductor substrate, the thickness of said insulating regions beneath the major surface of said semiconductor substrate being thinner at the interface of said insulating regions and said active regions;
   an insulating film formed over said semiconductor substrate in which said transistors and said field insulating regions are formed;
   a plurality of electrodes formed at contact holes extending through said insulating film, each said contact hole corresponding to one of said source and drain regions;
   a plurality of impurity regions of a second conductivity type, each said impurity region being formed at positions of said contact holes being deeper and having a higher impurity concentration than said source and drain regions, and adjacent ones of said impurity regions approaching each other under said field insulating region;
   wherein, the width of each said active region is partly narrowed at the contact holes, and each said field insulating region has a first width in a position adjacent said contact holes and a second width in a position adjacent said active areas in which said contact holes are not formed, said first width being larger than said second width.

2. A semiconductor integrated circuit device, comprising:
   a semiconductor substrate of a first conductivity type;
   a plurality of active regions extending parallel to each other, each said active region having a transistor comprising source and drain regions of a second conductivity type, a channel region and a gate electrode, said source region, drain region and said channel region formed therebetween being located along the extending direction of said active region;

field insulating regions formed between adjacent ones of said active regions, said insulating regions being formed at the surface of said semiconductor substrate, the thickness of said insulating regions beneath the major surface of said semiconductor substrate being thinner at the interface of said insulating regions and said active regions;

an insulating film formed over said semiconductor substrate in which said transistors and said field insulating regions are formed;

a plurality of electrodes formed at contact holes opened in said insulating film, each said contact hole formed to correspond to one of said source and drain regions;

a plurality of impurity regions of a second conductivity type, each said impurity region is formed at the positions of said contact holes and being deeper and having a higher impurity concentration than said source and drain regions, and adjacent ones of said impurity regions approaching each other under said field insulating region;

wherein, the width of each said active region is partly narrowed at the contact holes, and the width of said contact holes is larger than said narrowed portions of said active region, and each said field insulating region having a first width in a position adjacent said contact holes and a second width in a position adjacent active areas in which said contact holes are not formed, said first width being larger than said second width.

3. A semiconductor integrated circuit device, comprising:

a semiconductor substrate of a first conductivity type;

a plurality of active regions extending in parallel to each other, each said active region having a plurality of series connected transistors, each transistor comprising source and drain regions of second conductivity type, said transistors in each active region being arranged along the extending direction of said active region;

field insulating regions formed between adjacent ones of said active regions, said insulating regions being formed at the surface of said semiconductor substrate, the thickness of said insulating regions beneath the major surface of said semicondcutor substrate being thinner at the interface of said insulating regions and said active regions;

an insulating film formed over said semiconductor substrate in which said transistors and said field insulating regions are formed:

a plurality of electrodes formed at contact holes opened in said insulating film, each said contact hole corresponding to the connected portion of said transistors in each active region;

a plurality of impurity regions of a second conductivity type, each said impurity region formed at positions of said contact holes, and being deeper and having a higher impurity concentration than said source and drain regions, and adjacent ones of said impurity regions approaching each other under said field insulating region;

wherein, the width of each said active region being partly narrowed at the contact holes and the width of said contact holes being larger than that of the narrowed portions of said active region, and each said field insulating region has a first width in a position adjacent said contact holes and a second width in a position adjacent the active regions in which said contact holes are not formed, said first width being larger than said second width.

4. A semiconductor integrated circuit device, comprising:

a semiconductor substrate of a first conductivity type;

a plurality of active regions having a transistor extending in parallel to each other, each said active region comprising source and drain regions of a second conductivity type, a channel region and a gate electrode, said source region, drain region and said channel region formed therebetween being located along the extending direction of said active region;

field insulating regions formed between adjacent ones of said active regions, said insulating regions being formed at the surface of said semiconductor substrate, the thickness of said insulating regions beneath the major surface of said semiconductor substrate being thinner at the interface of said insulating regions and said active regions;

an insulating film formed over said semiconductor substrate in which said transistors and said field insulating regions are formed;

a plurality of electrodes formed at contact holes opened in said insulating film, each said contact hole corresponding to one of said source and drain regions, and ones of said electrodes are bit line electrodes and others of said electrodes are capacitor electrodes;

a plurality of impurity regions of a second conductivity type, each said impurity region formed at positions of said contact holes, and being deeper and having a higher impurity concentration than said source and drain regions, and adjacent ones of said impurity regions approaching each other under said field insulating region;

wherein, the width of each said active region is partly narrowed at the contact holes and the width of said contact holes being larger than that of narrowed portions of said active region, and each said field insulating region has a first width in a position adjacent said contact holes and a second width in a position adjacent said active areas in which said contact holes are not formed, said first width being larger than said second width.

5. A highly integrated device formed on a semiconductor substrate, comprising:

a number of element separating regions formed only at a surface of said substrate and extending parallel to each other;

a number of active regions defined between adjacent ones of said separating regions;

a number of transistors formed within each active region, each transistor having a channel region, an impurity diffused region functioning as a source and an impurity diffused region functioning as a drain, one of said impurity regions of each transistor making contact with an electrode at a contact region, each of said one impurity regions having a wide active region on each side thereof, one of said wide active regions being formed with the channel region of said transistor;

wherein each of said separating regions has a first width in a position adjacent said one impurity region of each transistor and a second width in a position adjacent said channel region of each transistor, said first width being larger than said second width, the active region of each transistor being substantially narrowed at said diffused region making contact with said electrode while relatively wide active regions are maintained in the channel region of each transistor to provide a high packing density with good transistor performance; and each transistor is provided with a capacitor which is charged or discharged through the transistor.

* * * * *